United States Patent
Tomomatsu et al.

(10) Patent No.: US 10,510,847 B2
(45) Date of Patent: Dec. 17, 2019

(54) TRANSISTOR WITH SOURCE FIELD PLATES UNDER GATE RUNNER LAYERS

(71) Applicant: Texas Instruments Incorporated, Dallas, TX (US)

(72) Inventors: Hiroyuki Tomomatsu, Dallas, TX (US); Hiroshi Yamasaki, Fukushima (JP); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/213,013

(22) Filed: Dec. 7, 2018

(65) Prior Publication Data
US 2019/0109195 A1   Apr. 11, 2019

Related U.S. Application Data

(63) Continuation of application No. 15/865,746, filed on Jan. 9, 2018, now Pat. No. 10,186,589, which is a
(Continued)

(51) Int. Cl.
| | |
|---|---|
| H01L 29/40 | (2006.01) |
| H01L 29/20 | (2006.01) |
| H01L 29/41 | (2006.01) |
| H01L 29/45 | (2006.01) |
| H01L 29/49 | (2006.01) |
| H01L 29/778 | (2006.01) |
| H01L 27/06 | (2006.01) |
| H01L 29/417 | (2006.01) |

(52) U.S. Cl.
CPC ........ *H01L 29/404* (2013.01); *H01L 27/0605* (2013.01); *H01L 29/2003* (2013.01); *H01L 29/41758* (2013.01); *H01L 29/452* (2013.01); *H01L 29/4966* (2013.01); *H01L 29/778* (2013.01); *H01L 29/7786* (2013.01); *H01L 29/7787* (2013.01); *H01L 29/402* (2013.01)

(58) Field of Classification Search
CPC .............. H01L 29/404; H01L 29/2003; H01L 29/41758; H01L 29/452; H01L 29/4966; H01L 29/778; H01L 29/7786; H01L 29/7787; H01L 27/0605
See application file for complete search history.

(56) References Cited

U.S. PATENT DOCUMENTS

| | | | |
|---|---|---|---|
| 5,506,434 A | 4/1996 | Yonemoto | |
| 5,959,357 A * | 9/1999 | Korman | ............ H01L 23/5389 |
| | | | 257/659 |

(Continued)

*Primary Examiner* — Ida M Soward
(74) *Attorney, Agent, or Firm* — Tuenlap Chan; Charles A. Brill; Frank D. Cimino

(57) ABSTRACT

A transistor device includes a field plate extending from a source contact layer and defining an opening above a gate metal layer. Coplanar with the source contact layer, the field plate is positioned close to the channel region, which helps reduce its parasitic capacitance. Meanwhile, the opening allows a gate runner layer above the field plate to access and connect to the gate metal layer, which helps reduce the resistance of the gate structure. By vertically overlapping the metal gate layer, the field plate, and the gate runner layer, the transistor device may achieve fast switching performance without incurring any size penalty.

20 Claims, 4 Drawing Sheets

Related U.S. Application Data continuation of application No. 15/395,015, filed on Dec. 30, 2016, now Pat. No. 9,899,484.

(56) References Cited

U.S. PATENT DOCUMENTS

| | | |
|---|---|---|
| 6,200,855 B1 | 3/2001 | Lee |
| 6,225,218 B1 | 5/2001 | Yamazaki et al. |
| 7,087,975 B2 | 8/2006 | Lehmann et al. |
| 7,262,117 B1 * | 8/2007 | Gunn, III .......... H01L 21/26506 |
| | | 438/481 |
| 7,375,387 B2 | 5/2008 | Willer |
| 8,183,637 B2 | 5/2012 | Fuchigami |
| 9,082,966 B2 * | 7/2015 | Albini ..................... H01L 45/06 |
| 9,093,432 B2 | 7/2015 | Iwabuchi et al. |
| 9,159,618 B2 | 10/2015 | Hijioka et al. |
| 9,406,623 B2 | 8/2016 | Mikhalev et al. |
| 9,444,047 B2 * | 9/2016 | Hashim .............. G11C 13/0007 |
| 9,466,615 B2 | 10/2016 | Miyairi et al. |
| 9,570,565 B2 | 2/2017 | Prechtl |
| 9,837,412 B2 * | 12/2017 | Tasbas .................... H01L 29/45 |
| 2003/0160324 A1 | 8/2003 | Dragon et al. |
| 2004/0032518 A1 * | 2/2004 | Benjamin ......... H01L 27/14623 |
| | | 348/294 |
| 2005/0205935 A1 * | 9/2005 | Mori ................. H01L 29/41733 |
| | | 257/347 |
| 2005/0274977 A1 | 12/2005 | Saito et al. |
| 2011/0049532 A1 * | 3/2011 | Odekirk .............. H01L 29/1066 |
| | | 257/77 |
| 2013/0020632 A1 | 1/2013 | Disney |
| 2014/0361374 A1 | 12/2014 | Knaipp |
| 2015/0262990 A1 | 9/2015 | Kanda et al. |
| 2016/0172490 A1 | 6/2016 | Lao et al. |
| 2016/0336410 A1 * | 11/2016 | Hsiao ................... H01L 29/404 |
| 2016/0372557 A1 | 12/2016 | Liao |
| 2017/0098614 A1 | 4/2017 | Harrison et al. |
| 2017/0110545 A1 | 4/2017 | Nagao et al. |

\* cited by examiner

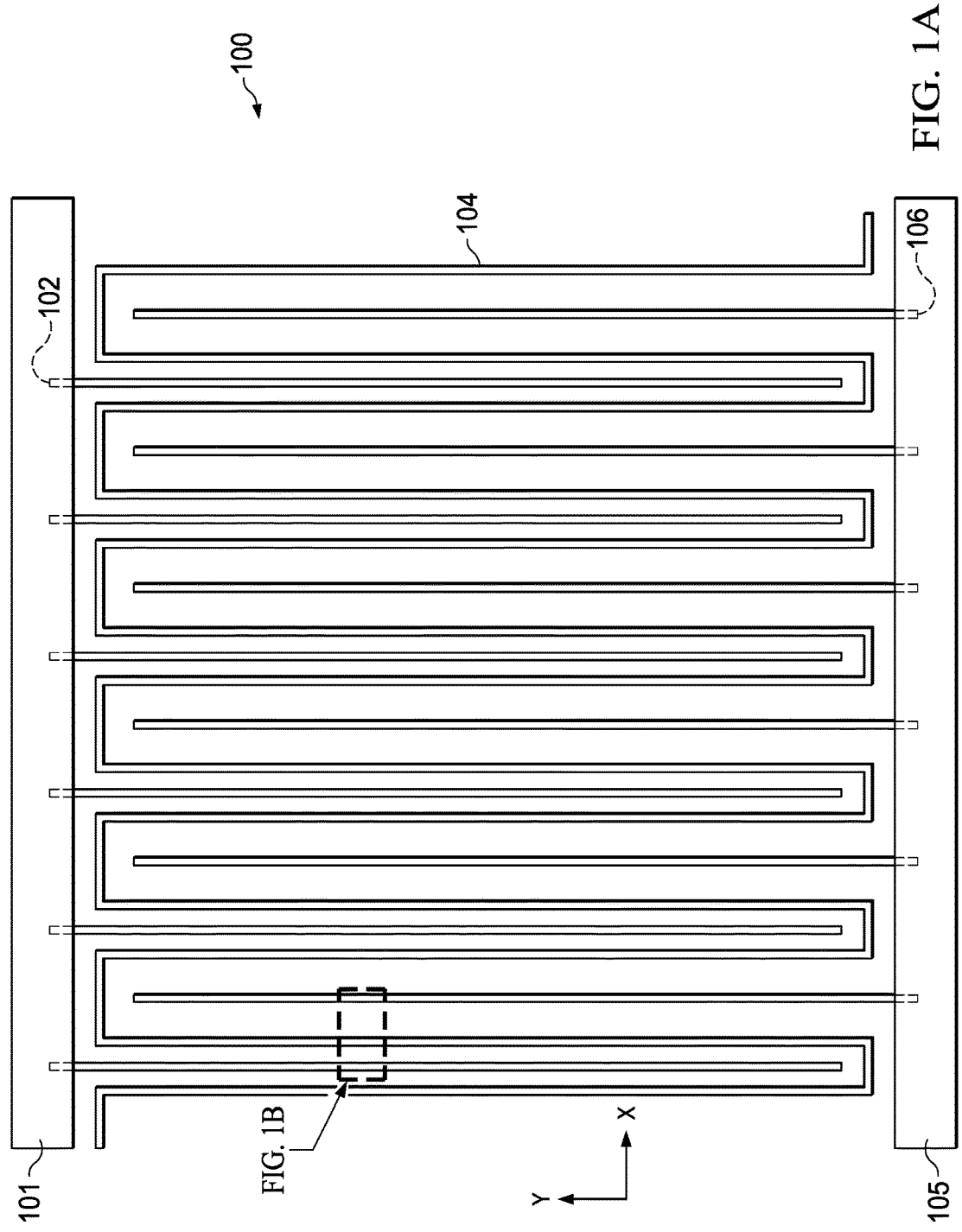

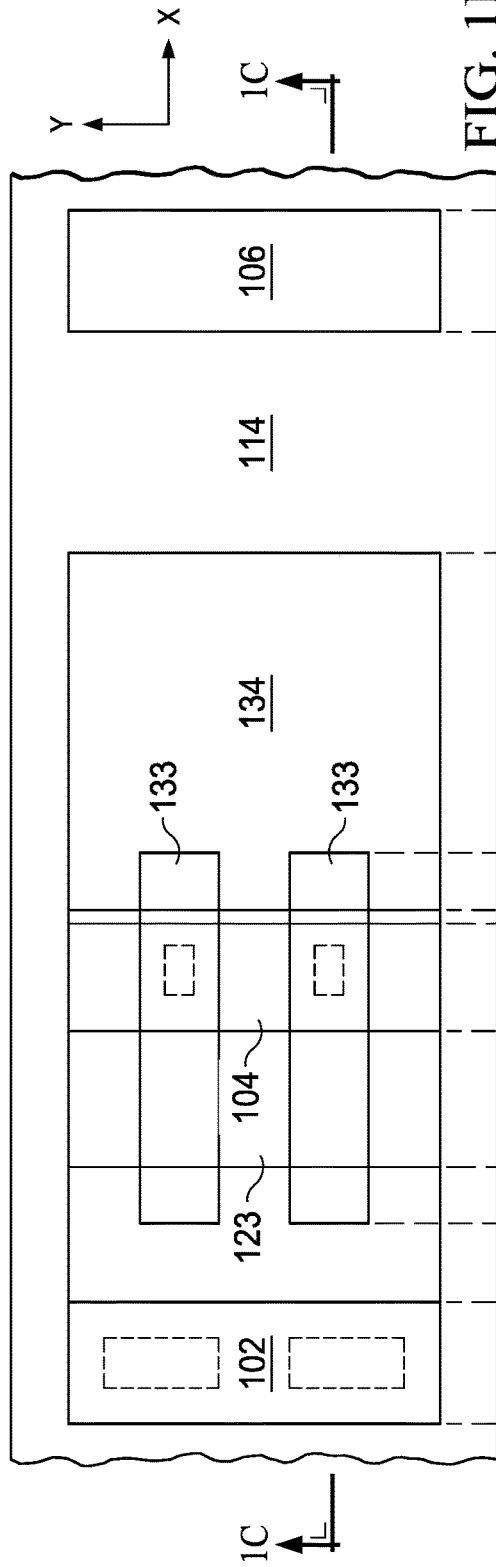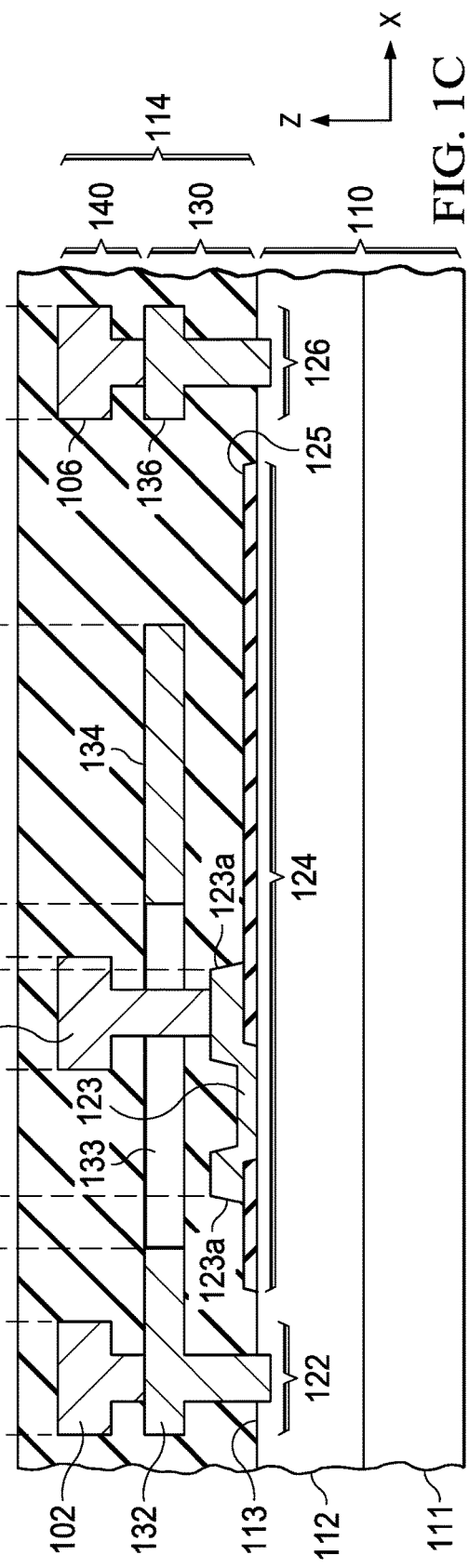

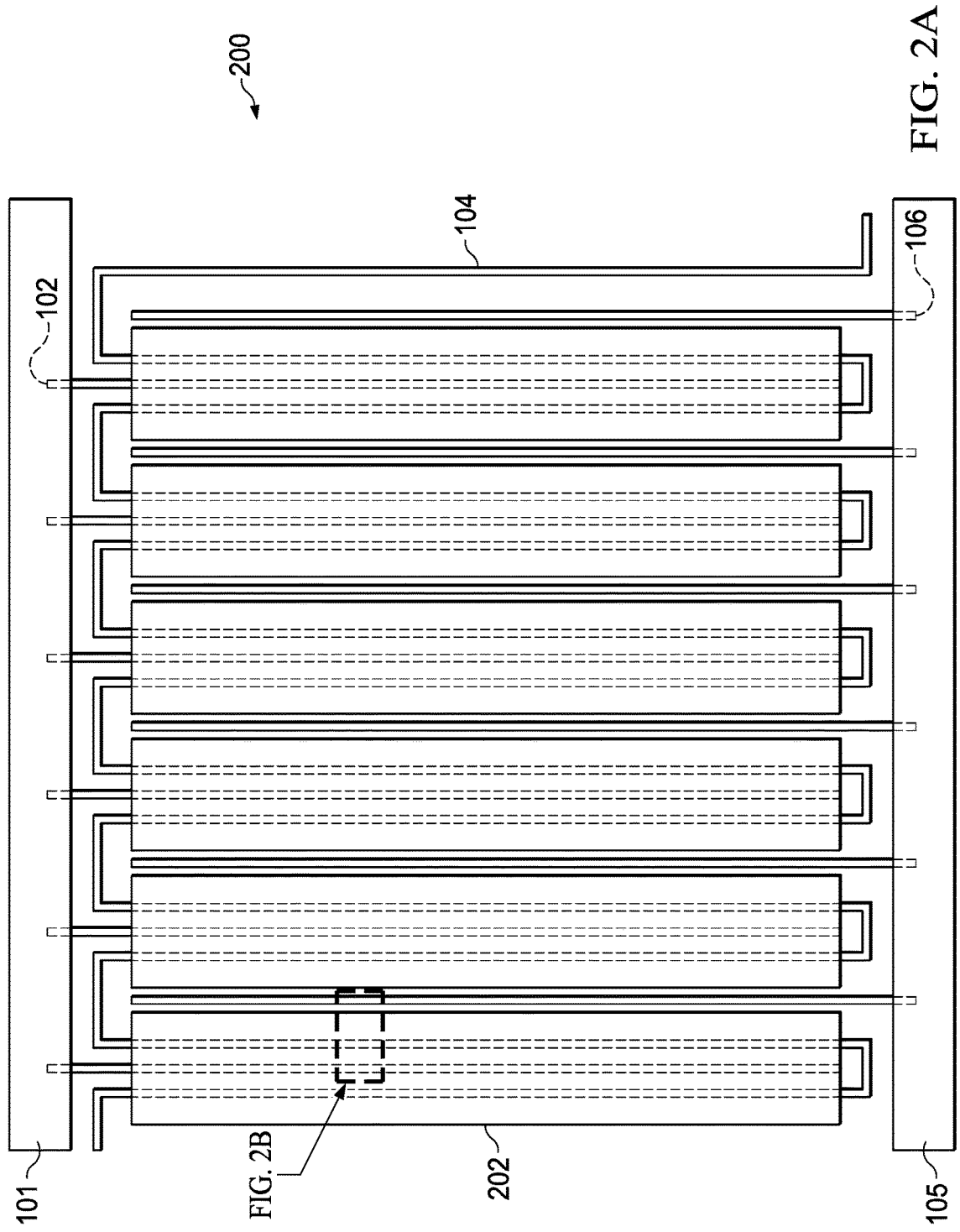

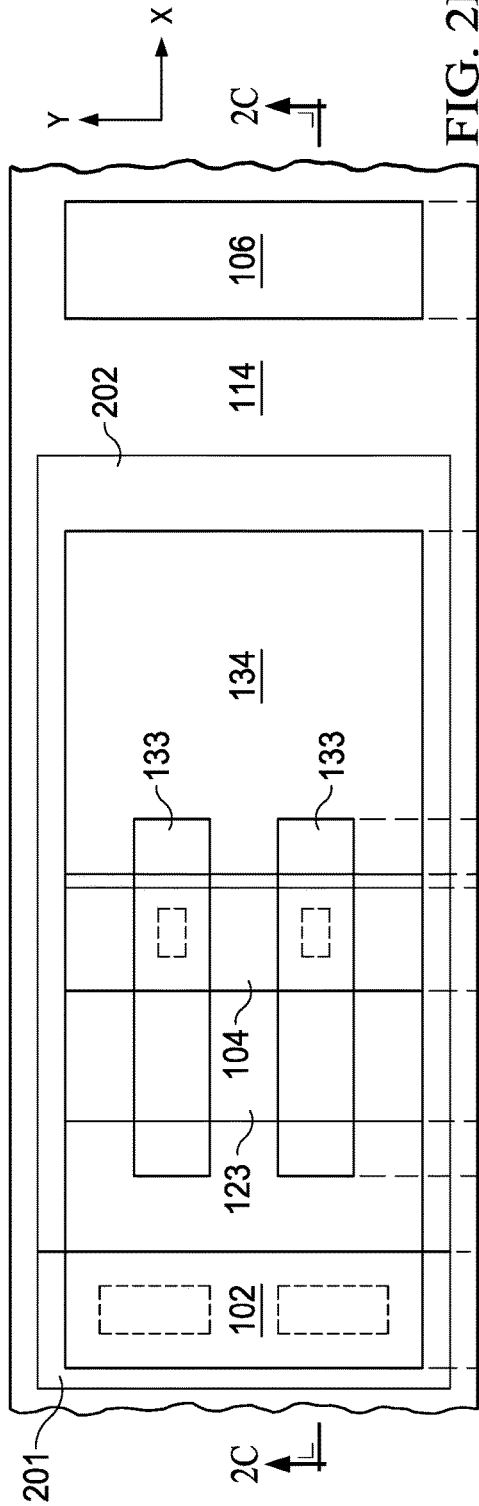
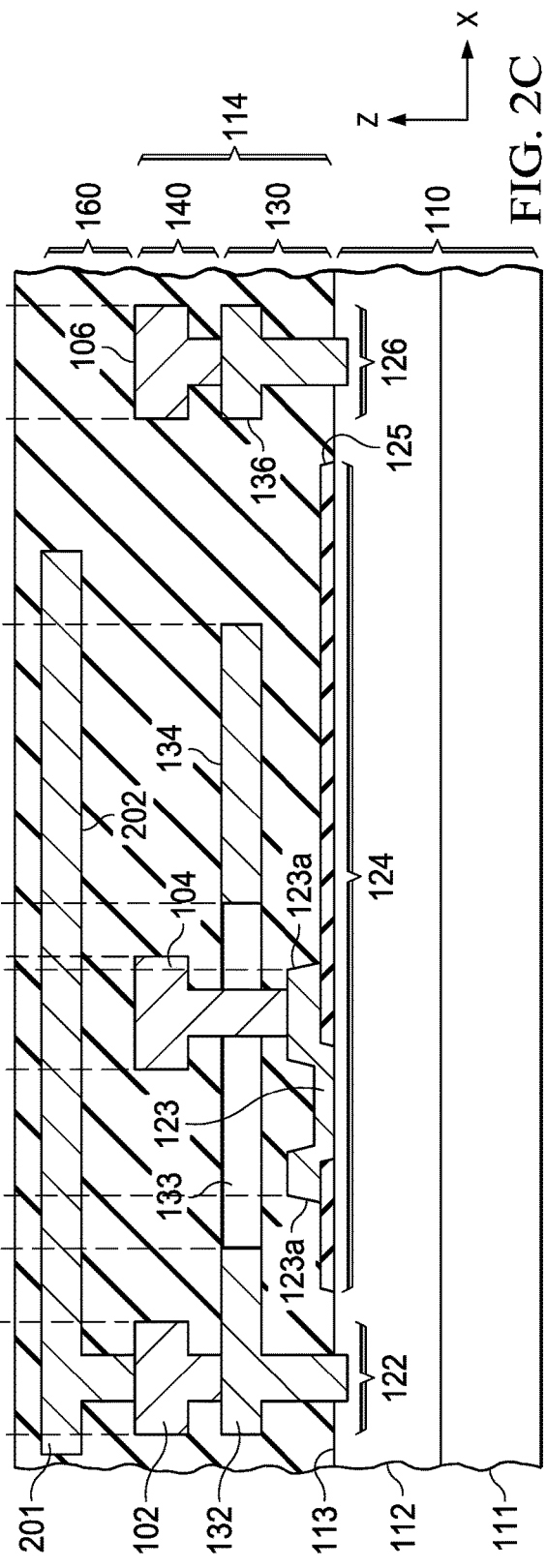

TRANSISTOR WITH SOURCE FIELD PLATES UNDER GATE RUNNER LAYERS

CROSS REFERENCE TO RELATED APPLICATIONS

Under 35 U.S.C. § 120, this continuation application claims benefits of priority to U.S. patent application Ser. No. 15/865,746 (TI-76802A), filed on Jan. 9, 2018, which is a continuation application claiming benefits of priority to U.S. patent application Ser. No. 15/395,015 (TI-76802), filed on Dec. 30, 2016. The entirety of the above referenced applications are hereby incorporated herein by reference.

BACKGROUND

High-voltage transistors, such as a high electron mobility transistor (HEMT), have wide industrial applications in high-voltage and fast switching operations. A gallium nitride (GaN) transistor is a type of HEMT device, which can withstand high drain-to-source voltage (e.g., greater than 100v) and provide fast switching speed. In general, a GaN transistor includes a drain region, a source region, a channel region, and a gate structure positioned above the channel region. For high speed switching, a GaN transistor may also include a field plate above the gate structure. The placement of the field plate may impact the design of the gate structure, which in turn presents several trade-offs between the performance and the size of a GaN transistor.

SUMMARY

The present disclosure provides a solution to enhance the performance of one or more HEMT devices without significantly increasing the size thereof. The disclosed solution simultaneously reduces the resistance of the gate structure and the parasitic capacitance associated with the field plate of a HEMT device, while avoiding additional routings. In one implementation, for instance, an HEMT device includes a field plate extending from a source contact layer and defining an opening above a gate metal layer. Coplanar with the source contact layer, the field plate is positioned close to the channel region, which helps reduce its parasitic capacitance. Meanwhile, the opening allows a gate runner layer above the field plate to access and connect to the gate metal layer, which helps reduce the resistance of the gate structure. By vertically overlapping the metal gate layer, the field plate, and the gate runner layer, the disclosed HEMT device may achieve significant size efficiency without additional routings.

DRAWING DESCRIPTIONS

FIG. 1A shows a top exposed view of a transistor device according to an aspect of the present disclosure.

FIG. 1B shows a partial layout view of the transistor device according to an aspect of the present disclosure.

FIG. 1C shows a cross-sectional view of the transistor device according to an aspect of the present disclosure.

FIG. 2A shows a top exposed view of a transistor device with a second source field plate according to an aspect of the present disclosure.

FIG. 2B shows a partial layout view of the transistor device with the second source field plate according to an aspect of the present disclosure.

FIG. 2C shows a cross-sectional view of the transistor device with the second source field plate according to an aspect of the present disclosure.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

FIG. 1A shows a top exposed view of a transistor device 100 according to an aspect of the present disclosure. The transistor device 100 may be a standalone discrete device fabricated on a single semiconductor die. Alternatively, the transistor device 100 may be incorporated to one or more circuits fabricated on a single integrated circuit die. The transistor device 100 as shown in FIG. 1A may include additional layers above and below the labeled components. But for the clear illustration of the labeled components therein, these additional layers are not shown in FIG. 1A.

The transistor device 100 includes a lower metal layer (see, e.g., structure 140 in FIG. 1C) that includes a source runner layer 102, a gate runner layer 104, and a drain runner layer 106. The source runner layer 102 includes multiple source fingers, and the drain runner layer 106 includes multiple drain fingers interleaving with the source fingers. As such, the source runner layer 102 and the drain runner layer 106 coextends in parallel and along a dimension y of a channel region (see, e.g., structure 124 in FIGS. 1B and 1C). The dimension y may be oriented along a channel width of the channel. The gate runner layer 104 includes multiple gate fingers connected to form a serpentine structure that interposed between the multiple drain fingers and source fingers. Along the dimension y above the channel region, the multiple gate fingers (of the gate runner layer 104) coextend in parallel with the multiple source fingers (of the source runner layer 102) and the multiple drain fingers (of the drain runner layer). And in one configuration, the gate runner layer 104 is positioned closer to the source runner layer 102 than the drain runner layer 106.

The transistor device 100 also includes an upper metal layer (see, e.g., structure 160 in FIG. 2C) positioned above the lower metal layer. Among other things, the upper metal layer includes a source terminal conductor 101 and a drain terminal conductor 105. The source terminal conductor 101 extends along a dimension x of the channel region (e.g., structure 124 in FIGS. 1B and 1C), and it is connected to the source fingers of the source runner layer 102. The dimension x may be oriented along a channel length of the channel. As such, the dimension x deviates from the dimension y. In one implementation, for example, the dimension x is perpendicular to the dimension y. As such, the source terminal conductor 101 is perpendicular to the source fingers of the source runner layer 102. Likewise, the drain terminal conductor 105 extends along the dimension x of the channel region, and it is connected to the drain fingers of the drain runner layer 106. In the implementation where the dimension y is perpendicular to the dimension x, the drain terminal conductor 105 is perpendicular to the drain fingers of the drain runner layer 106.

Referring to FIGS. 1B and 1C, which show a partial layout view and a cross-sectional view associated with FIG.

1A, the transistor device 100 includes multiple layers along a dimension z and multiple layout regions along a plane (an "x-y plane") defined by the dimension y and the dimension x. More particularly, the transistor device 100 includes a semiconductor substrate 110 and a dielectric layer 114 positioned on the semiconductor substrate. Along the dimension z, the semiconductor substrate 110 may include a first semiconductor layer 111 and a second semiconductor layer 112. The first semiconductor layer 111 may be a first gallium nitride (GaN) layer, which includes a first GaN material. The second semiconductor layer 112 may be a second GaN layer, which includes a second GaN material such as aluminum gallium nitride (AlGaN). Along the x-y plane and a top surface 113 of the semiconductor layer 110, the transistor device 100 includes a source region 122, a drain region 126, and a channel region 124. The channel region 124 has a first end and a second end being positioned between the source region 122 and the drain region 126 respectively.

Above the semiconductor substrate 110 and within the dielectric layer 114, the transistor device 100 includes a first metal layer 130. The first metal layer 130 includes a conductive material, such that the first metal layer 130 may be used as a contact layer for establishing ohmic contacts with various regions of the semiconductor substrate 110. In one implementation, the first metal layer 130 may include an alloy layer and an interface layer positioned on the alloy layer. In one implementation, for example, the alloy layer comprises titanium (Ti), aluminum (Al), and copper (Cu), whereas the interface layer comprises a nitride material, such as titanium nitride (TiN). The first metal layer 130 may be used for forming a source contact layer 132 and a drain contact layer 136. The source contact layer 132 makes ohmic contact with the source region 122, whereas the drain contact layer 136 makes ohmic contact with the drain region 126.

The transistor device 100 includes a gate metal layer 123 contacting the channel region 124. The gate metal layer 123 is positioned between the source contact layer 132 and the drain contact layer 136. In one implementation, the gate metal layer 123 is positioned closer to the source contact layer 132 than the drain contact layer 136. A gate dielectric layer 125 surrounds the gate metal layer 123, and thus it shields the gate metal layer 123 from the source contact layer 132 and the drain contact layer 136. In one implementation, for example, the gate dielectric layer 125 may include a nitride material, such as silicon nitride. The transistor device 100 includes a pair of gate field plates 123a extending laterally and above the gate metal layer 123. The gate field plates 123a are insulated from the channel region 124 by the gate dielectric layer 125. The gate metal layer 123 and the gate field plates 123a each includes a barrier metal layer and an interface layer on the barrier metal layer. In one implementation, the gate metal layer 123 may include silver (Au) and/or platinum (Pt) as these materials provide low gate resistance (Rgate). However, silver and platinum are expensive and relatively thick, and they may present stress issue and integration issue during the fabrication process. To reduce the thickness of the gate structure, the gate metal structure 123 may include a material with slightly higher resistance but is relatively resilient against fabrication stress. For example, the barrier metal layer of the gate metal layer 123 may include a titanium tungsten (TiW) material, whereas the interface layer of the gate metal layer 123 may include a titanium nitride (TiN) material.

In general, low gate resistance (Rgate) improves the switching speed of the transistor device 100. One way to reduce the gate resistance is by reducing the length of each gate finger (as shown and described in FIG. 1A) and by increasing the number of gate fingers. Such a gate resistance reduction scheme involves similar reconfigurations for the source fingers and the drain fingers as well. As a result, additional area may be needed for additional routings, which will increase the size of the transistor device 100.

Another way to reduce the gate resistance is by applying a layer of runner metal layer, which has lower resistivity than the underlying metal layer (e.g., 130 and 123). In one implementation, for example, the transistor device 100 includes the gate runner layer 104 to reduce the overall gate resistance (Rgate) contributed by the gate metal layer 123. The gate runner layer 104 is a part of a second metal layer 140, which has a lower resistivity than the gate meal layer 123 and the first metal layer 130. In one implementation, for example, the second metal layer 104 may include an aluminum (Al) material. In another implementation, for example, the second metal layer 140 may include a lead (Pb) material. The second metal layer 104 also encompasses the source runner layer 102 and the drain runner layer 106.

Like the gate runner layer 104, the source runner layer 102 and the drain runner layer 106 each serves to reduce the overall resistance of the source contact layer 132 and the drain contact layer 136 respectively. More particularly, the source runner layer 102 and the drain runner layer 106 each makes ohmic contact with the respective source contact layer 132 and the respective drain contact layer 136 at predetermined intervals. The spatial and structural relationships among the source runner layer 102, the gate runner layer 104, and the drain runner layer 106 as shown in FIGS. 1B and 1C are consistent with the description of FIG. 1A. Moreover, the source runner layer 102, the gate runner layer 104, and the drain runner layer 106 are substantially coplanar along the x-y plane as shown in FIG. 1C. For instance, these runner layers 102, 104, and 106 are formed during the same process steps such that they are aligned along the same process plane level with slight shifts introduced by process variations of their respective underlying layers.

For high speed switching, the transistor device 100 includes a field plate to be positioned near the channel region 124. Where the field plate is coupled to the source region 122, the gate-to-drain parasitic capacitance ($C_{gd}$) and the gate-to-gate parasitic capacitance ($C_{gg}$) can be minimized. Thus, the transistor device 100 adopts a source field plate configuration. To allow a source field plate to be positioned near the channel region 124, the first metal layer 130 may be used for forming the source field plate. In one implementation, for example, the transistor device 100 includes a source field plate 134 extending from the source contact layer 132 along the dimension x of the channel region 124 and over the gate metal layer 123.

Because the source field plate 134 extends from and source contact layer 132, the source field plate 134 has the same resistivity as the source contact layer 132, which is typically higher than the gate runner layer 104. Moreover, the source field plate 134 is substantially coplanar with the source contact layer 132 and the drain contact layer 136. For instance, the source field plate 134 and the contact layers 132 and 136 are formed during the same process steps such that they are aligned along the same process plane level with slight shifts introduced by process variations of their respective underlying layers. Along the dimension z, the source field plate 134 is positioned in between the gate metal layer 123 and the gate runner layer 104. Moreover, the source field plate 134 is separated from the gate metal layer 123, the gate field plate 123a, and the gate runner layer 104 by an insulating layer, which can be the dielectric layer 114.

The source field plate 134 defines one or more windows (i.e., openings) 133 along a vertical space above the gate metal layer 123 and the gate field plate 123a. In one implementation, the openings 133 has a width that is wider than the width of the gate metal layer 123 in combination with the gate field plate 123a along the dimension x. Through the openings 133, the gate runner layers 104 may access and make ohmic contact with the gate metal layer 123 and/or the gate field plate layer 123a. The openings 133 allow the source field plate 134 to be placed below the gate runner layer 104 without obstructing or shorting the connection path between the gate runner layer 104 and the gate metal layer 123 (and/or the gate field plate 123a).

The low placement of the source field plate 134 is advantageous for several reasons. First, the low placement allows the source field plate 134 to be formed alongside with the source contact layer 132, which reduces the vertical size of the transistor device 100. Second, the low placement of the source field plate 134 helps reduce process complexity. Third, the low placement of the source field plate 134 maximizes its effectiveness when compared to field plates with higher placements, which distance farther away from the channel region 124.

In an alternative implementation, the source field plate 134 may be formed as an extension of the source runner layer 102 instead of the source contact layer 132. Although this implementation may achieve similar size efficiency and process efficiency, the effectiveness of the source field plate may be reduced for its increased distance from the channel region 124. That being said, a second source field plate with a higher placement may supplement the source field plate 134. Referring to FIGS. 2A-2C, for example, a transistor device 200 may include a second source field plate 202 to supplement the source field plate 134. The transistor device 200 is similar to the transistor device 100 in that these two devices include components with the same numeric references. As such, the transistor device 200 has the same structural and functional characteristics as the transistor device 100 with respect to these components.

The second source field plate 202 is a part of a third metal layer 160, which is above the first metal layer 130 and the second metal layer 140. In general, the third metal layer 160 has a resistivity that is lower than the first metal layer 130 and the second metal layer 140. For example, the third metal layer 160 may include a copper (Cu) material. Besides the second source field plate 202, the third metal layer 160 may also include the source terminal conductor 101 and the drain terminal conductor 105. The second source field plate 202 coextends with the source runner layer 102 along the dimension y. Moreover, the second source field plate 202 extends away from the source runner layer 102 and the source contact layer 122 and along the dimension x farther than the source field plate 134.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A device, comprising:
a semiconductor substrate having a channel region;
a source contact layer contacting the a surface of the semiconductor substrate;
a gate layer above the channel region;
a source field plate defining an opening for accessing the gate layer; and
a gate runner layer above the source field plate, the gate runner layer accessing the gate layer through the opening.

2. The device of claim 1, wherein the source contact layer and the source field plate share a common metal layer having a higher resistivity than the gate runner layer.

3. The device of claim 2, wherein the common metal layer includes an aluminum-copper-titanium alloy.

4. The device of claim 1, wherein the semiconductor substrate includes a gallium nitride layer contacted by the source contact layer.

5. The device of claim 1, wherein the gate layer includes a titanium tungsten material.

6. The device of claim 1, further comprising:
a source runner layer coplanar and coextending with the gate runner layer, the source runner layer contacting the source contact layer.

7. The device of claim 1, wherein:
the source field plate extends from the source contact layer along a first dimension of the channel region and over the gate layer; and
the gate runner layer extends along a second dimension of the channel region deviating from the first dimension.

8. The device of claim 7, wherein the first dimension is perpendicular to the second dimension.

9. The device of claim 7, further comprising:
a second source field plate extending above the gate runner layer along the first dimension farther away from the source contact layer than the source field plate.

10. The device of claim 1, further comprising:
an insulation layer separating the source field plate from the gate layer.

11. A transistor, comprising:
a semiconductor substrate having a channel region;
a source contact layer contacting a first end of the channel region;
a drain contact layer contacting a second end of the channel region;
a gate layer above the channel region and closer to the source contact layer than the drain contact layer;
a source field plate defining an opening for accessing the gate layer;
a gate runner layer above the source field plate, the gate runner layer coupled to the gate layer through the opening;
a source runner layer coplanar and coextending with the gate runner layer, the source runner layer contacting the source contact layer; and
a drain runner layer coplanar and coextending with the gate runner layer, the drain runner layer contacting the drain contact layer.

12. The transistor of claim 11, wherein the source contact layer and the source field plate share a common metal layer having a higher resistivity than the gate runner layer.

13. The transistor of claim 11, wherein the semiconductor substrate includes a gallium nitride layer contacted by the source contact layer and the drain contact layer.

14. The transistor of claim 11, wherein:
the source field plate extends from the source contact layer along a first dimension of the channel region and over the gate layer; and
the gate runner layer extends along a second dimension of the channel region perpendicular to the first dimension.

15. The transistor of claim 14, further comprising:
a second source field plate extending above the gate runner layer along the first dimension farther away from the source contact layer than the source field plate.

16. An integrated circuit, comprising:
a semiconductor substrate having a surface; and
transistors, each including:
a channel region defined on the surface;
a source contact layer contacting a first end of the channel region;
a drain contact layer contacting a second end of the channel region;
a gate layer above the channel region and closer to the source contact layer than the drain contact layer;
a source field plate extending from the source contact layer defining an opening for accessing the gate layer;
a gate runner layer above the source field plate, and accessing the gate layer through the opening;
a source runner layer coplanar and coextending with the gate runner layer, the source runner layer contacting the source contact layer; and
a drain runner layer coplanar and coextending with the gate runner layer, the drain runner layer contacting the drain contact layer.

17. The integrated circuit of claim 16, wherein the source contact layer and the source field plate share a common metal layer having a higher resistivity than the gate runner layer.

18. The integrated circuit of claim 16, wherein the semiconductor substrate includes a gallium nitride layer contacted by the source contact layer and the drain contact layer.

19. The integrated circuit of claim 16, wherein:
the source field plate extends from the source contact layer along a first dimension of the channel region and over the gate layer; and
the gate runner layer extends along a second dimension of the channel region perpendicular to the first dimension.

20. The integrated circuit of claim 19, wherein each of the transistors includes:
a second source field plate extending above the gate runner layer along the first dimension farther away from the source contact layer than the source field plate.

* * * * *